(12) United States Patent
Narioka

(10) Patent No.: US 10,423,064 B2
(45) Date of Patent: Sep. 24, 2019

(54) IMPRINT APPARATUS AND METHOD OF MANUFACTURING ARTICLE

(71) Applicant: CANON KABUSHIKI KAISHA, Tokyo (JP)

(72) Inventor: Shintaro Narioka, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 254 days.

(21) Appl. No.: 14/953,870

(22) Filed: Nov. 30, 2015

(65) Prior Publication Data

US 2016/0151961 A1 Jun. 2, 2016

(30) Foreign Application Priority Data

Dec. 2, 2014 (JP) .................................. 2014-244381

(51) Int. Cl.
*G03F 7/00* (2006.01)

(52) U.S. Cl.
CPC .................................. *G03F 7/0002* (2013.01)

(58) Field of Classification Search
CPC ............................... G03F 7/0022; G03F 7/0002
See application file for complete search history.

(56) References Cited

U.S. PATENT DOCUMENTS 5,997,963 A * 12/1999 Davison .................. C23C 16/44
118/722
7,090,716 B2 8/2006 McMackin et al.
7,611,348 B2 * 11/2009 Van Santen ........... B29C 43/021
264/319
8,202,463 B2 * 6/2012 Yoneda ............... B29C 37/0053
264/101
8,637,587 B2 1/2014 Xu et al.
8,749,753 B2 * 6/2014 Tanaka .................. F16C 29/025
355/30
9,770,850 B2 * 9/2017 Mizuno ................. B29C 43/203
(Continued)

FOREIGN PATENT DOCUMENTS

JP       2007509769 A    4/2007
JP       2013026573 A    2/2013
(Continued)

OTHER PUBLICATIONS

Office Action issued in Taiwanese Appln. No. 104136506 dated Jul. 13, 2016. English translation provided.
(Continued)

*Primary Examiner* — Robert C Dye
*Assistant Examiner* — Nicholas R Krasnow
(74) *Attorney, Agent, or Firm* — Rossi, Kimms & McDowell LLP

(57) ABSTRACT

The present invention provides an imprint apparatus that performs imprint processing of forming a pattern of an imprint material on a substrate using a mold, the apparatus including a chuck configured to hold the mold, a head configured to support the chuck to be able to drive the chuck, the head being fixed to a base, a plate member configured to be arranged between the base and the substrate so as to surround the chuck, and a first supply unit configured to supply a first gas to a first space so as to form an air flow from the first space between the plate member and the substrate toward a second space outside the first space.

15 Claims, 12 Drawing Sheets

(56) References Cited

U.S. PATENT DOCUMENTS

| | | | |
|---|---|---|---|
| 10,201,927 B2* | 2/2019 | Mizuno | B29C 59/026 |
| 2002/0192951 A1* | 12/2002 | Morita | H01L 21/28556 |
| | | | 438/654 |
| 2003/0070620 A1* | 4/2003 | Cooperberg | C23C 16/45574 |
| | | | 118/723 AN |
| 2004/0211755 A1* | 10/2004 | Yusa | C03C 17/002 |
| | | | 216/54 |
| 2005/0184436 A1* | 8/2005 | Jeong | B29C 35/0888 |
| | | | 264/496 |
| 2005/0264132 A1* | 12/2005 | Choi | B82Y 10/00 |
| | | | 310/311 |
| 2006/0033898 A1* | 2/2006 | Cadee | G03F 7/70341 |
| | | | 355/53 |
| 2006/0043626 A1* | 3/2006 | Wu | B82Y 10/00 |
| | | | 264/101 |
| 2006/0131682 A1* | 6/2006 | Moors | G03F 7/70908 |
| | | | 257/432 |
| 2006/0237881 A1* | 10/2006 | Guo | B82Y 10/00 |
| | | | 264/496 |
| 2007/0063384 A1* | 3/2007 | Choi | B29C 43/003 |
| | | | 264/319 |
| 2007/0275114 A1* | 11/2007 | Cherala | B29C 43/003 |
| | | | 425/405.1 |
| 2008/0105649 A1* | 5/2008 | Chandrachood | B82Y 10/00 |
| | | | 216/47 |
| 2009/0213343 A1* | 8/2009 | Sewell | G01F 1/662 |
| | | | 355/30 |
| 2010/0059904 A1* | 3/2010 | Kasumi | B29C 59/022 |
| | | | 264/293 |
| 2010/0085555 A1* | 4/2010 | Schmid | B82Y 10/00 |
| | | | 355/76 |
| 2010/0245791 A1* | 9/2010 | Jacobs | G03F 7/70341 |
| | | | 355/30 |
| 2011/0140304 A1* | 6/2011 | Choi | B82Y 10/00 |
| | | | 264/293 |
| 2011/0214694 A1* | 9/2011 | Toshima | B08B 5/00 |
| | | | 134/21 |
| 2011/0316193 A1* | 12/2011 | Kawakami | B29C 43/003 |
| | | | 264/293 |
| 2012/0199997 A1* | 8/2012 | Tanabe | B82Y 10/00 |
| | | | 264/82 |
| 2013/0171838 A1* | 7/2013 | Okuda | H01L 21/0217 |
| | | | 438/778 |
| 2013/0237064 A1* | 9/2013 | Kirikihira | H01L 21/67109 |
| | | | 438/758 |
| 2013/0241096 A1* | 9/2013 | Shudo | B29C 59/022 |
| | | | 264/40.5 |
| 2013/0320589 A1* | 12/2013 | Fujita | B29C 59/026 |
| | | | 264/293 |
| 2013/0323431 A1* | 12/2013 | Horibe | B08B 7/0057 |
| | | | 427/510 |
| 2014/0051016 A1* | 2/2014 | Chiou | G03F 1/22 |
| | | | 430/5 |
| 2014/0242809 A1* | 8/2014 | Hashimoto | H01L 21/02126 |
| | | | 438/778 |
| 2014/0287594 A1* | 9/2014 | Terasaki | H01L 21/02164 |
| | | | 438/770 |
| 2014/0327183 A1* | 11/2014 | Mori | G03F 7/0002 |
| | | | 264/293 |
| 2015/0241796 A1* | 8/2015 | Ebert, Jr. | G03F 7/70716 |
| | | | 355/30 |
| 2016/0297116 A1* | 10/2016 | Toyoshima | B29C 43/56 |
| 2017/0246658 A1* | 8/2017 | Sakamoto | H01L 21/6715 |
| 2019/0094687 A1* | 3/2019 | Narioka | G03F 7/0002 |

FOREIGN PATENT DOCUMENTS

| | | | | |
|---|---|---|---|---|
| JP | 2013519228 A | 5/2013 | | |
| JP | 2014056854 A | 3/2014 | | |
| JP | 5539113 B2 | 7/2014 | | |
| TW | 201028272 A | 8/2010 | | |
| WO | 2005033797 A2 | 4/2005 | | |
| WO | WO-2013042350 A1 * | 3/2013 | | B29C 59/002 |

OTHER PUBLICATIONS

Office Action issued in Japanese Appln. No. 2014-244381 dated Sep. 14, 2018.

* cited by examiner

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint technique is a technique capable of forming a nanoscale fine pattern, and is receiving attention as one mass production nanolithography technique for semiconductor devices and magnetic storage media. An imprint apparatus using the imprint technique forms a pattern on a substrate by curing an imprint material (resin) in a state in which a mold (original), on which the pattern is formed, and the resin on the substrate contact each other, and then releasing the mold from the cured imprint material. Imprint apparatuses implement various resin curing methods in accordance with application purposes. As a mass production technique for semiconductor devices and the like, a photo-curing method of curing an imprint material on a substrate by irradiation with light such as ultraviolet light is generally employed.

If a gas remains near a mask at the time of filling the pattern (recessed portion) of a mold with an imprint material on a substrate in the imprint apparatus, the pattern formed on the substrate may be distorted. Japanese Patent Laid-Open No. 2007-509769 discloses a technique of decreasing gas pockets present in a resin on a substrate to reduce the distortion of a pattern formed on the substrate. In Japanese Patent Laid-Open No. 2007-509769, the imprint material on the substrate is saturated with a highly soluble gas, a highly diffusible gas, or a highly soluble and diffusible gas such as helium.

As a method for obtaining a state in which a resin on a substrate is saturated with helium, there is known a method of arranging a helium supply nozzle around a mold so as to face a substrate, and substituting (purging) a space between the mold and the substrate with helium. This method can satisfactorily saturate the resin on the substrate with helium.

In the imprint apparatus, not a distortion but a defect (pattern defect) may be generated in a pattern formed on a substrate. For example, if imprint processing is performed in a shot region where particles are attached, a pattern defect is generated in the shot region. If imprint processing is performed in a shot region where large particles are attached, the mold may be damaged. If the mold is damaged, all shot regions having undergone imprint processing using the mold have pattern defects. Thus, it is necessary to minimize the attachment of particles to a substrate, particularly, the attachment of large particles serving as a cause of the damage of the mold. However, there are proposed only few techniques for suppressing the attachment of particles to a substrate in the imprint apparatus, and a concrete measure needs to be presented.

SUMMARY OF THE INVENTION

The present invention provides an imprint apparatus advantageous for reducing the attachment of particles to a substrate.

According to one aspect of the present invention, there is provided an imprint apparatus that performs imprint processing of forming a pattern of an imprint material on a substrate using a mold, the apparatus including a chuck configured to hold the mold, a head configured to support the chuck to be able to drive the chuck, the head being fixed to a base, a plate member configured to be arranged between the base and the substrate so as to surround the chuck, and a first supply unit configured to supply a first gas to a first space so as to form an air flow from the first space between the plate member and the substrate toward a second space outside the first space.

Further aspects of the present invention will become apparent from the following description of exemplary embodiments with reference to the attached drawings.

DESCRIPTION OF THE EMBODIMENTS

Figure 1:
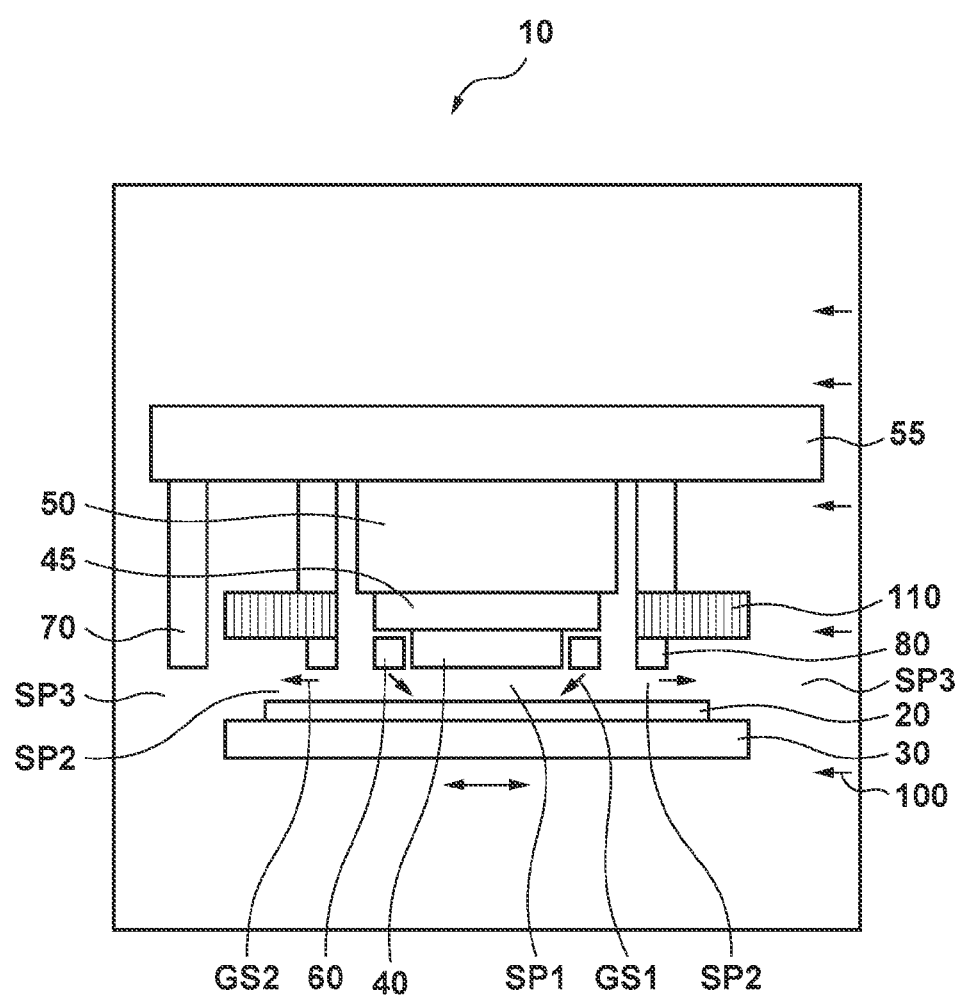
FIG. 1 is a schematic view showing the arrangement of an imprint apparatus according to the first embodiment of the present invention.

Preferred embodiments of the present invention will be described below with reference to the accompanying drawings. Note that the same reference numerals denote the same members throughout the drawings, and a repetitive description thereof will not be given.

Figure 12:
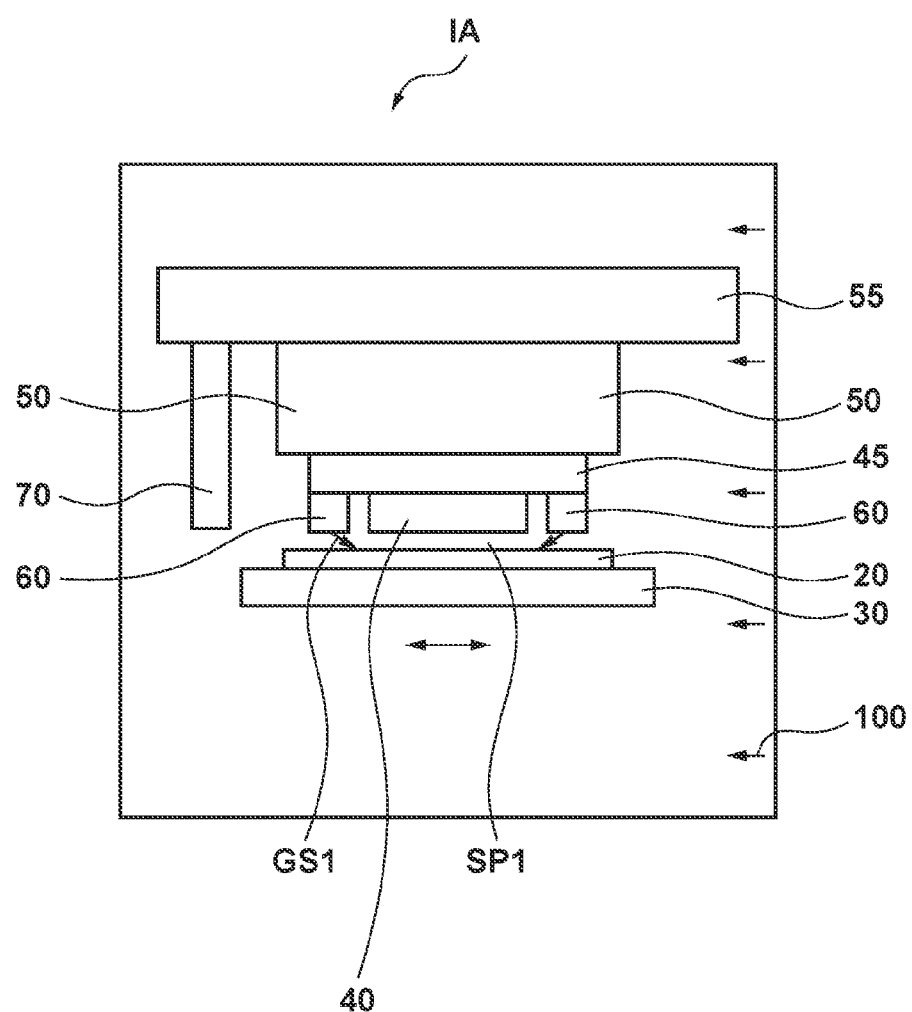
FIG. 12 is a schematic view showing the arrangement of an imprint apparatus as a comparative example.

FIG. 12 is a schematic view showing the arrangement of an imprint apparatus IA as a comparative example. The imprint apparatus IA is a lithography apparatus that forms a pattern on a resin serving as an imprint material on a substrate by using a mold. The imprint apparatus IA includes a chuck 45 that holds a mold 40, a head 50 that is fixed to a base 55 and supports the chuck 45 so that the chuck 45 can be driven, and a stage 30 that holds a substrate 20 and moves. The imprint apparatus IA also includes a gas supply unit 60 that supplies a gas GS1 to a space SP1 between the mold 40 and the substrate 20, and a dispenser 70 that discharges (supplies) a resin onto a substrate.

The gas supply unit 60 includes a nozzle and the like, and is arranged outside the mold 40, specifically, around the mold 40. The gas supply unit 60 supplies, to a resin on a substrate, a highly soluble gas, a highly diffusible gas, or a highly soluble and diffusible gas such as helium as the gas GS1.

The imprint apparatus IA performs imprint processing of forming a pattern on a substrate by curing a resin in a state in which the resin supplied from the dispenser 70 and the mold 40 contact each other, and then releasing the mold 40 from the cured resin. At this time, the internal space of the imprint apparatus IA is air-conditioned by a gas 100 supplied (blown) from an air conditioner (not shown). The gas 100 is a clean gas which passes through a filter having a particle removal function, for example, an ultra low penetration air (ULPA) filter and in which the density of particles is reduced.

Figure 13:
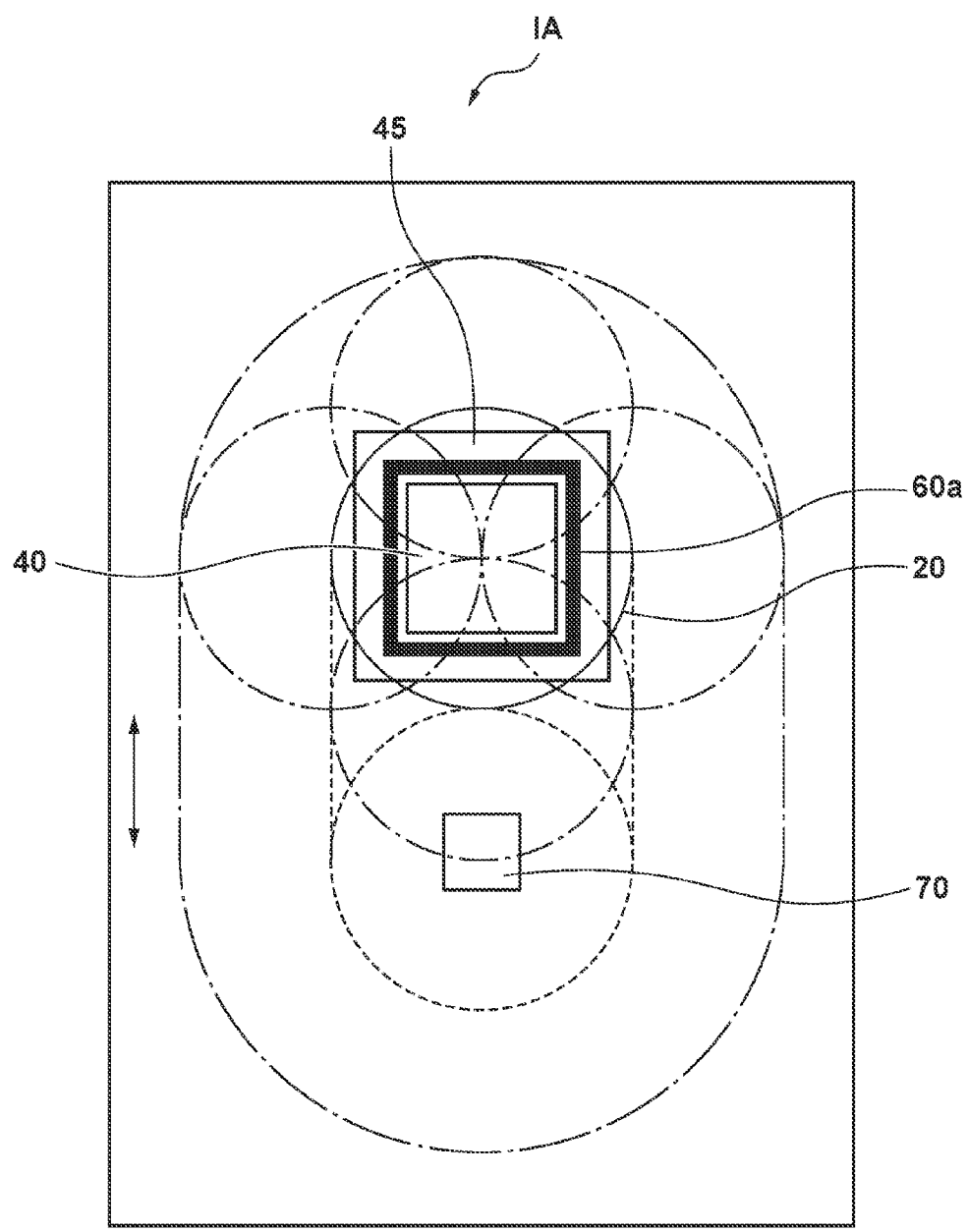
FIG. 13 is a view for explaining the moving region of a substrate in the imprint apparatus shown in FIG. 12.

FIG. 13 is a view for explaining the moving region of the substrate 20 held by the stage 30 in the imprint apparatus IA. As shown in FIG. 13, a nozzle 60a that sprays the gas GS1 is arranged on the chuck 45 so as to surround the mold 40 held by the chuck 45. The imprint apparatus IA repeats an operation of supplying a resin from the dispenser 70, driving the chuck 45 by the head 50, and bringing the mold 40 and the resin into contact with each other for each shot region of the substrate 20. Meanwhile, the substrate 20 held by the stage 30 is moved in the imprint apparatus (to be referred to as "in the apparatus" hereinafter).

Referring to FIG. 13, a circle represented by a solid line indicates a position of the substrate 20 when performing imprint processing in a shot region at the center of the substrate 20. A circle represented by a broken line indicates a position of the substrate 20 when supplying a resin to the shot region at the center of the substrate 20. The substrate 20 moves in an elliptic region indicated by a thick broken line until imprint processing is performed after supplying the resin to the shot region at the center of the substrate 20.

Similarly, referring to FIG. 13, four circles each represented by a chain line indicate positions of the substrate 20 when performing imprint processing in shot regions at the upper end, lower end, left end, and right end of the substrate 20. Although not shown, there are positions of the substrate 20 when supplying the resin to the shot regions at the upper end, lower end, left end, and right end of the substrate 20. When performing imprint processing on the entire surface of the substrate 20, that is, in all shot regions, the substrate 20 moves in the elliptic region indicated by the thick broken line.

If the imprint apparatus IA performs imprint processing in a shot region where particles are attached, a pattern defect is generated in this shot region. If the imprint apparatus IA performs imprint processing in a shot region where large particles are attached, the mold 40 may be damaged. If the mold 40 is damaged, all shot regions having undergone imprint processing using the mold 40 have pattern defects.

To minimize the attachment of particles to substrate 20, the number of particles in the apparatus is minimized. The number of particles in the apparatus is given by multiplying the particle density in the apparatus by the volume in the apparatus:

number of particles in apparatus=particle density in apparatus [number of particles/m³]×volume [m³]   (1)

The particle density in the apparatus is given by dividing the number of particles generated in the apparatus per unit time by the flow rate of the gas 100 supplied in the apparatus:

particle density in apparatus [number of particles/m³]=number of particles generated in apparatus [number of particles/s]/flow rate of gas 100 [m³/s]   (2)

From equations (1) and (2), the number of particles in the apparatus is given by:

number of particles in apparatus=number of particles generated in apparatus [number of particles/s]× volume [m³]/flow rate of gas 100 [m³/s]   (3)

A value obtained by dividing the flow rate of the gas 100 supplied in the apparatus by the volume in the apparatus will be called a ventilation rate. The ventilation rate is given by:

ventilation rate [1/s]=flow rate of gas 100 [m³/s]/ volume [m³]   (4)

By using the ventilation rate, equation (3) is rewritten into:

number of particles in apparatus=number of particles generated in apparatus [number of particles/s]/ ventilation rate [1/s]   (5)

To reduce the number of particles in the apparatus, it is considered to reduce the number of particles generated in the apparatus or increase the ventilation rate.

To reduce the number of particles generated in the apparatus, it suffices to specify a particle generation source (dust generation source) in the apparatus, and take a measure against it. However, various driving units including the stage 30 and the head 50 exist in the apparatus, and it is difficult to reduce particles generated from them. Since members used in the apparatus diversify, it is difficult to take a measure to reduce the generation of particles. As a comparative example, therefore, it is considered to increase the ventilation rate, thereby reducing the number of particles generated in the apparatus (to be referred to as an "in-apparatus particle count reduction measure" hereinafter).

Figure 14A:
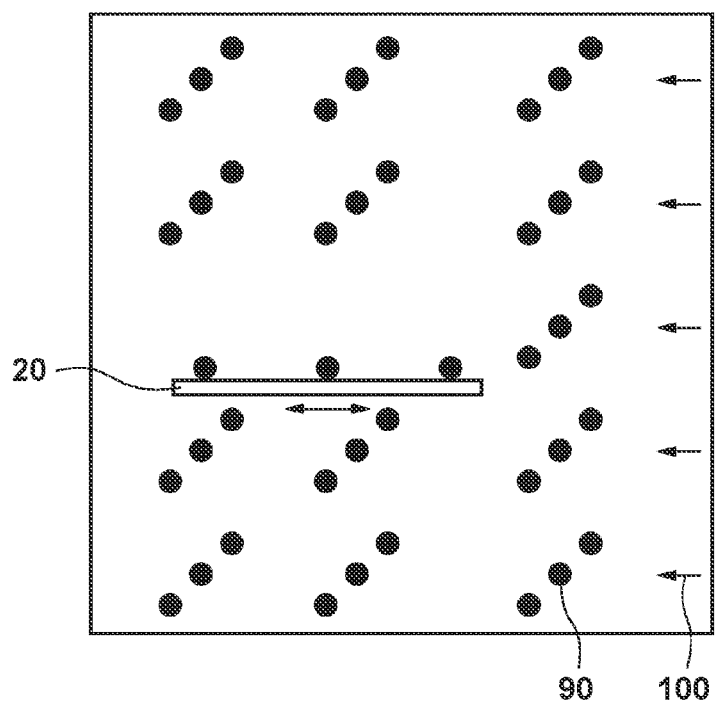
FIGS. 14A and 14B are views for explaining an in-apparatus particle count reduction measure in the comparative example.
Figure 14B:
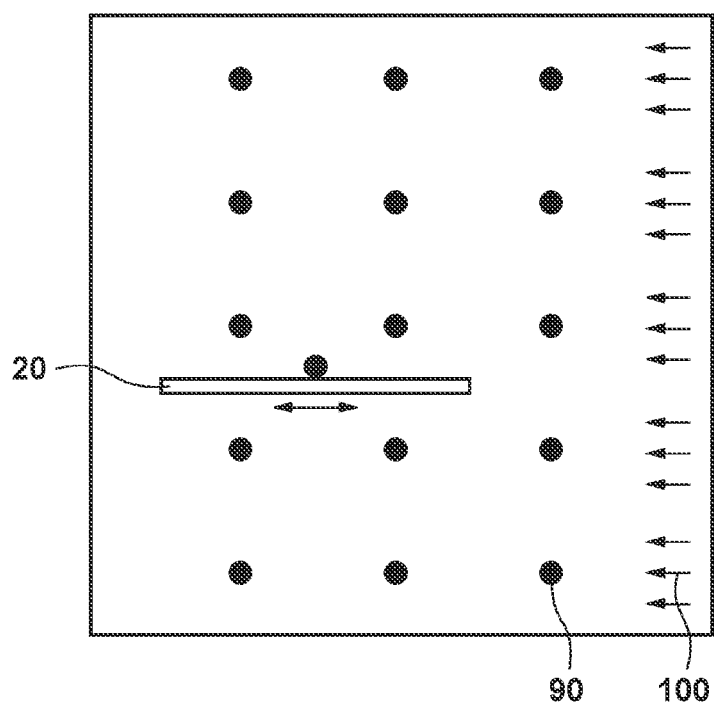

FIGS. 14A and 14B are views for explaining the in-apparatus particle count reduction measure in the comparative example. FIG. 14A schematically shows the number of particles in the apparatus and the number of particles attached to the substrate 20 before executing the in-apparatus particle count reduction measure. FIG. 14B schematically shows the number of particles in the apparatus and the number of particles attached to the substrate 20 after executing the in-apparatus particle count reduction measure. The number of particles 90 generated per unit time in the apparatus is assumed to be unchanged before and after the in-apparatus particle count reduction measure. The volume in the apparatus schematically represented by the size of the internal space of the imprint apparatus IA is assumed to be unchanged before and after the in-apparatus particle count reduction measure. Further, in FIGS. 14A and 14B, the flow rate of the gas 100 supplied to the internal space of the imprint apparatus IA is schematically indicated by the number of arrows. In the comparative example, the flow rate of the gas 100 after the in-apparatus particle count reduction measure becomes triple the flow rate of the gas 100 before the in-apparatus particle count reduction measure, as shown in FIGS. 14A and 14B. In other words, the ventilation rate after the in-apparatus particle count reduction measure becomes triple the ventilation rate before the in-apparatus particle count reduction measure.

As described above, the number of particles in the apparatus can be given by equation (5). When the ventilation rate is tripled, the number of particles in the apparatus becomes ⅓ before and after the in-apparatus particle count reduction measure, as shown in FIGS. 14A and 14B.

In the imprint apparatus IA, a direct cause of the pattern defect is particles attached to the substrate 20. The probability at which particles in the apparatus are attached to the substrate 20 is assumed to be constant. Then, if the number of particles in the apparatus is reduced to, for example, ⅓, the number of particles attached to the substrate 20 becomes ⅓, as shown in FIGS. 14A and 14B.

In this manner, to increase the ventilation rate in the imprint apparatus IA, the flow rate of the gas 100 supplied from the air conditioner (fan) needs to be increased, so the air conditioner needs to be upsized. In addition, to maintain the cleanliness of the gas 100 supplied from the air conditioner, the number of ULPA filters also needs to be increased in accordance with the increase in the flow rate of the gas 100. Thus, when the ventilation rate is increased in the imprint apparatus IA, the air conditioning system including the air conditioner and the ULPA filter becomes bulky with respect to the volume in the apparatus.

<First Embodiment>

FIG. 1 is a schematic view showing the arrangement of an imprint apparatus 10 according to the first embodiment of the present invention. Similar to the imprint apparatus IA, the imprint apparatus 10 is a lithography apparatus that forms a pattern on a resin serving as an imprint material on a substrate by using a mold. The imprint apparatus 10 performs imprint processing of forming a pattern on a substrate by curing a resin in a state in which the resin supplied from a dispenser 70 and a mold 40 contact each other, and then releasing the mold 40 from the cured resin. At this time, the internal space of the imprint apparatus 10 is air-conditioned by a gas 100 supplied (blown) from an air conditioner (not shown).

The imprint apparatus 10 includes a chuck 45 that holds the mold 40, a head 50 that is fixed to a base 55 and supports the chuck 45 so that the chuck 45 can be driven, and a stage 30 that holds a substrate 20 and moves. The imprint apparatus 10 also includes a gas supply unit (second supply unit) 60 that supplies a gas (second gas) GS1 to a space (third space) SP1 between the mold 40 and the substrate 20, and the dispenser 70 that discharges (supplies) a resin onto a substrate. In addition, the imprint apparatus 10 includes a plate member 110 that is arranged between the base 55 and the substrate 20 so as to surround the chuck 45. Further, the imprint apparatus 10 includes a gas supply unit (first supply unit) 80 that supplies a gas (first gas) GS2 to a space (first space) SP2 between the plate member 110 and the substrate 20.

The gas supply unit 80 includes a nozzle and the like, and is arranged outside the gas supply unit 60, specifically, to surround the gas supply unit 60. The gas supply unit 80 supplies the clean gas GS2 so as to form an air flow from the space SP2 between the plate member 110 and the substrate 20 toward a space (second space) SP3 outside (space distant from the space SP2 and other than the spaces SP1 and SP2) the space SP2. The gas GS2 contains at least one of, for example, clean dry air, helium, and nitrogen, which will be described later.

Figure 2:
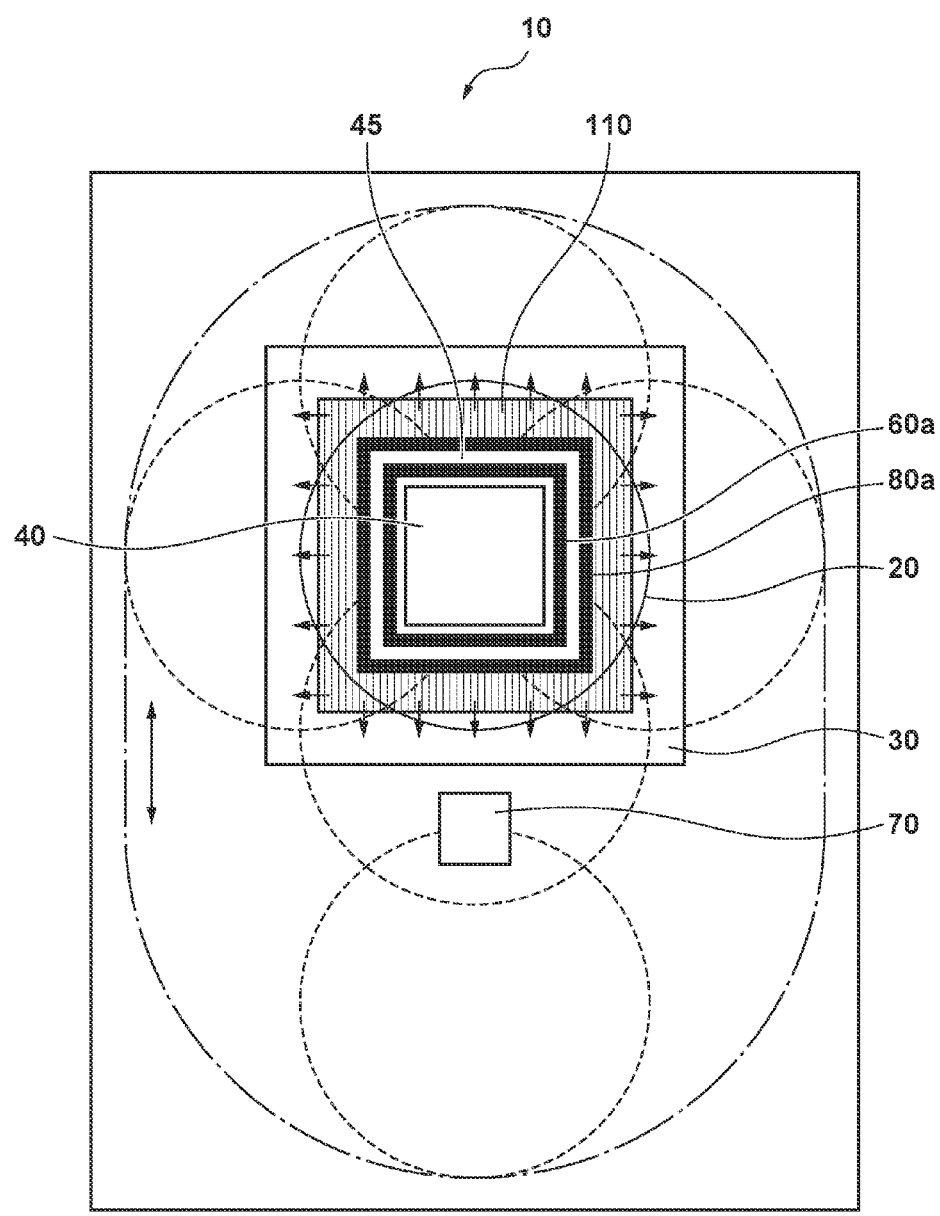
FIG. 2 is a view for explaining the moving region of a substrate in the imprint apparatus shown in FIG. 1.

FIG. 2 is a view for explaining the moving region of the substrate 20 held by the stage 30 in the imprint apparatus 10. As shown in FIG. 2, a nozzle (second nozzle) 60a that sprays the gas GS1 is arranged on the chuck 45 so as to surround the mold 40 held by the chuck 45. A nozzle (first nozzle) 80a that sprays the gas GS2 is arranged on the plate member 110 so as to surround the nozzle 60a.

In FIG. 2, as in the comparative example (FIG. 13), a circle represented by a solid line indicates a position of the substrate 20 when performing imprint processing in a shot region at the center of the substrate 20. Five circles each represented by a broken line indicate positions of the substrate 20 when performing imprint processing in shot regions at the upper end, lower end, left end, and right end of the substrate 20, and a position of the substrate 20 when supplying a resin to the shot region at the upper end of the substrate 20. An elliptic region indicated by a thick chain line represents the moving region of the substrate 20 when performing imprint processing on the entire surface of the substrate 20, that is, in all shot regions. The plate member 110 is configured to cover at least part of the moving region of the substrate 20 held by the stage 30, as represented by hatching. In this embodiment, the plate member 110 is arranged between the head-side surface of the chuck 45 and the substrate-side surface of the mold 40 held by the chuck 45, as shown in FIG. 1.

Figure 3:
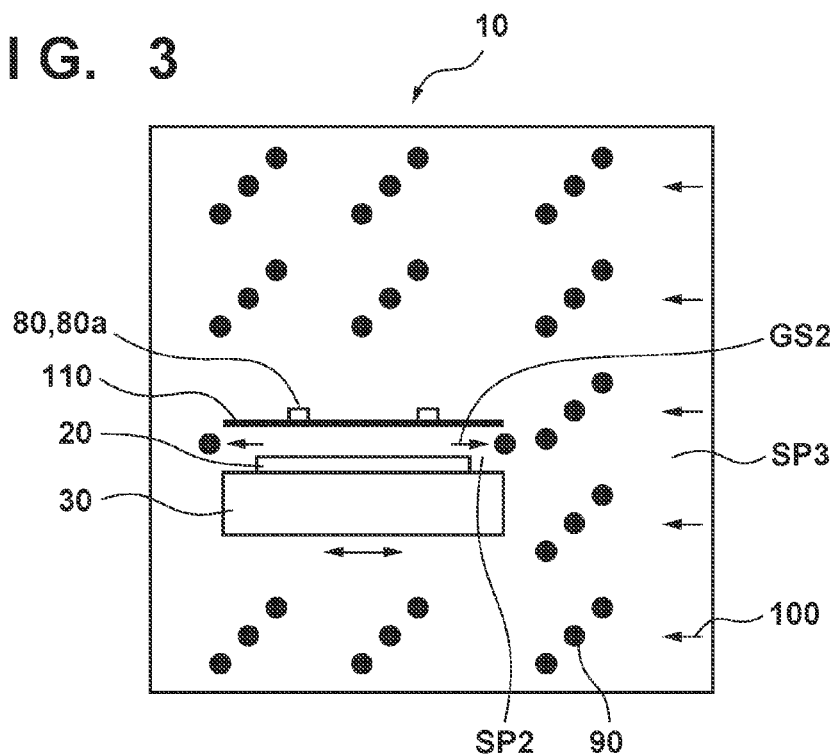
FIG. 3 is a view for explaining the function of the gas supply unit of the imprint apparatus shown in FIG. 1.

FIG. 3 is a view for explaining the function of the gas supply unit 80 (nozzle 80a). As described above, the internal space of the imprint apparatus 10 is air-conditioned by the gas 100 supplied from the air conditioner, and particles 90 generated in the apparatus float. The plate member 110 is provided to face the substrate 20 held by the stage 30, and is supported by the base 55. The upper surface of the stage 30, that is, the holding surface of the substrate 20 has almost the same plane as the substrate 20. The plate member 110 may be supported by the head 50.

As described above, the gas supply unit 80 supplies the gas GS2 to the space SP2 between the plate member 110 and the substrate 20. Since the gas GS2 supplied from the gas supply unit 80 flows from the space SP2 to the space SP3, the inflow of the particles 90 floating in the apparatus into the space SP2 can be suppressed. Even if the number of particles in the apparatus is not reduced, the inflow of particles to the vicinity (space SP2) of the substrate 20 can be suppressed, and the number of particles attached to the substrate 20 can be reduced. In this way, the imprint apparatus 10 can reduce particles attached to the substrate 20 without bloating the air conditioning system including the air conditioner and the ULPA filter.

Figure 4:
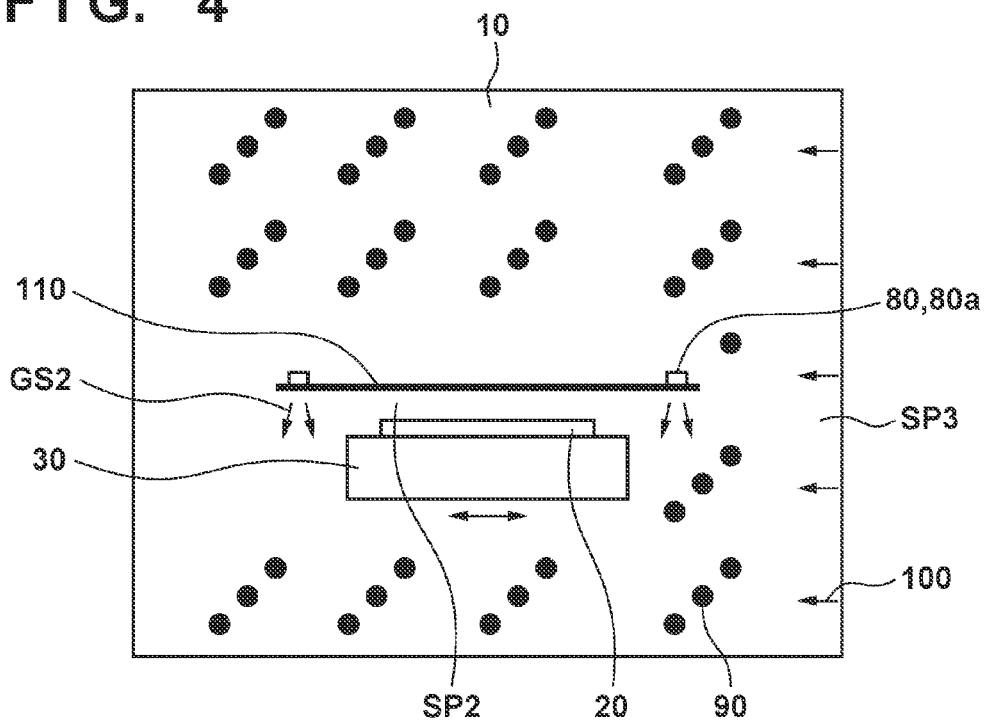
FIG. 4 is a view for explaining the arrangement of the gas supply unit of the imprint apparatus shown in FIG. 1.
Figure 5:
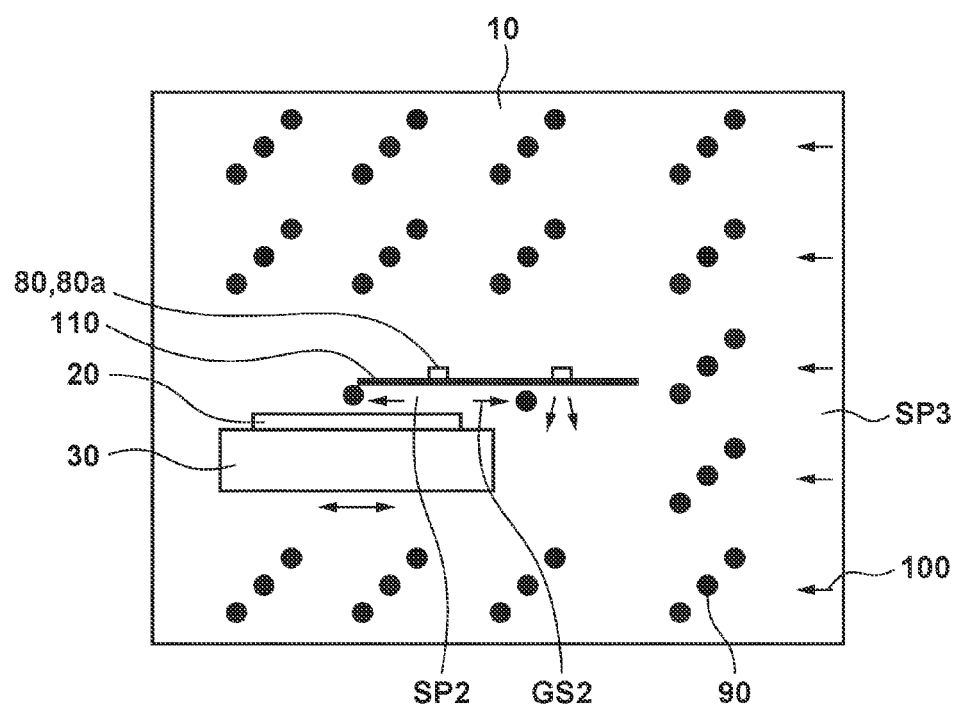
FIG. 5 is a view for explaining the arrangement of the gas supply unit of the imprint apparatus shown in FIG. 1.

A preferable arrangement of the gas supply unit 80 (nozzle 80a) will be explained with reference to FIGS. 3, 4, and 5. In FIG. 4, the gas supply unit 80 is arranged further outside the plate member 110, that is, at the outer edge portion of the plate member 110, in comparison with FIG. 3. In FIG. 4, the stage 30 is positioned at the center of the plate member 110, and the upper surface of the stage 30 does not exist immediately below the gas supply unit 80. In this case, the gas supply unit 80 cannot supply the gas GS2 to the space SP2 between the plate member 110 and the substrate 20, and the inflow of particles into the vicinity of the substrate 20, specifically, into the space SP2 cannot be suppressed. Hence, the gas supply unit 80 is preferably arranged so that the upper surface of the stage 30 always exists immediately below the gas supply unit 80.

To always arrange the upper surface of the stage 30 immediately below the gas supply unit 80, the stage 30 needs to be upsized. This may increase the footprint of the imprint apparatus 10. Therefore, the gas supply unit 80 is preferably arranged on the plate member 110 so that at least part (of the nozzle 80a) of the gas supply unit 80 faces the stage 30 even if the stage 30 moves, as shown in FIG. 5. In other words, the gas supply unit 80 is preferably arranged on the plate member 110 so that at least part of the gas supply unit 80 is positioned in the space SP2 between the plate member 110 and the substrate 20 when performing imprint processing. Since the gas supply unit 80 can supply the gas GS2 to the space SP2 between the plate member 110 and the substrate 20, the inflow of the particles 90 floating in the apparatus into the space SP2 can be suppressed.

A preferable flow rate of the gas GS2 to be supplied from the gas supply unit 80 will be explained. The number of particles in the apparatus in the comparative example is given by equation (5). Similarly, the number of particles in the apparatus according to this embodiment is assumed to be given by equation (5). Also, the number of particles in the space SP2 between the plate member 110 and the substrate 20 is assumed to be given by equation (5). However, when obtaining the number of particles in the space SP2, "number of particles generated in apparatus [number of particles/s]" in equation (5) is rewritten into "number of particles generated in space SP2 [number of particles/s]".

As for the generation amount of particles, the space SP2 between the plate member 110 and the substrate 20 is always included in the apparatus, so the number of particles generated in the space SP2 always becomes equal to or smaller than the number of particles generated in the apparatus. In this embodiment, the number of particles generated in the space SP2 is assumed to be equal to the number of particles generated in the apparatus in consideration of the strictest condition.

On this assumption, to decrease the number of particles in the space SP2 between the plate member 110 and the substrate 20 to be smaller than the number of particles in the apparatus, the ventilation rate in the space SP2 is set to be higher than the ventilation rate in the apparatus in accordance with equation (5). A flow rate at which this condition is satisfied is set as the flow rate of the gas GS2 to be supplied from the gas supply unit 80.

From equation (4), the ventilation rate in the space SP2 between the plate member 110 and the substrate 20 is given by the flow rate of the gas GS2 supplied to the space SP2 [$m^3$/s]/the volume of the space SP2 [$m^3$]. In this fashion, the ventilation rate in the space SP2 depends on even the volume of the space SP2.

Figure 6A:
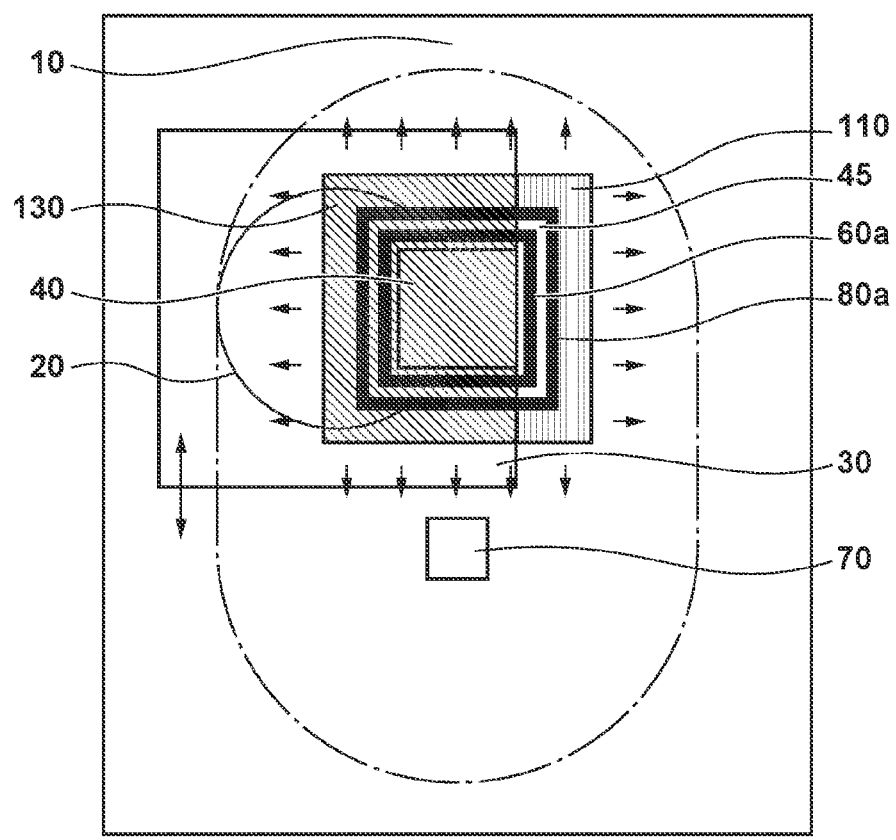
FIGS. 6A and 6B are views for explaining the volume of a space between the plate member and substrate of the imprint apparatus shown in FIG. 1.
Figure 6B:
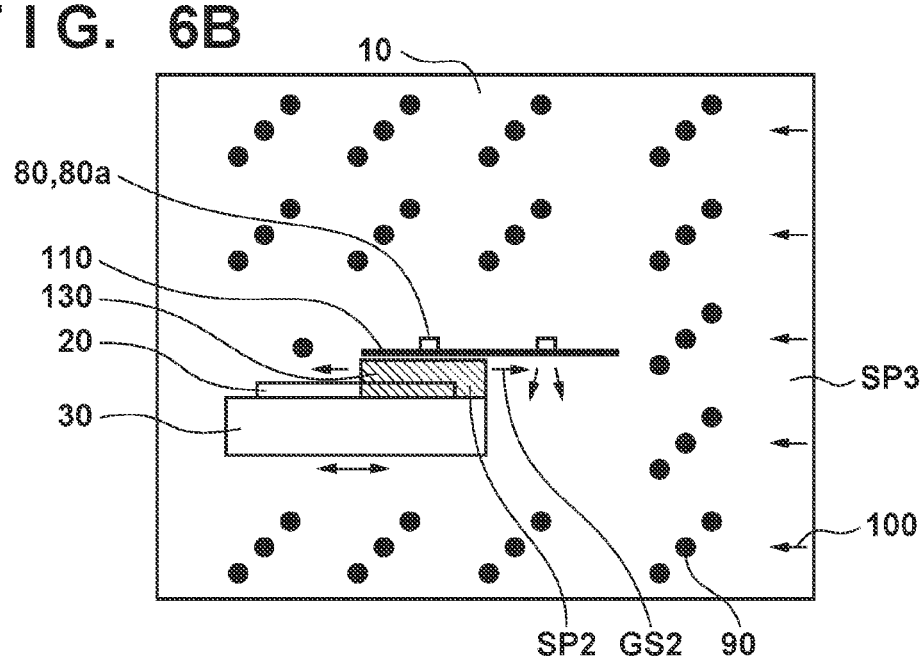

The volume of the space SP2 between the plate member 110 and the substrate 20 will be explained with reference to FIGS. 6A and 6B. FIGS. 6A and 6B are a schematic plan view and schematic sectional view, respectively, showing the positional relationship between the plate member 110 and the stage 30. In FIG. 6A, a region where the plate member 110 and the upper surface of the stage 30 having almost the same plane as the substrate 20 overlap each other is represented by hatching. In FIG. 6B, the gap between the plate member 110 and the upper surface of the stage 30 having almost the same plane as the substrate 20, that is, the space SP2 is represented by hatching. The region represented by hatching indicates the volume of the space SP2. When the upper surface of the stage 30 does not have almost the same plane as the substrate 20, a region where the plate member 110 and the substrate 20 overlap each other indicates the volume of the space SP2.

When part (of the nozzle 80a) of the gas supply unit 80 moves apart from the stage 30, as shown in FIG. 6B, the gas GS2 to be supplied from the gas supply unit 80 does not contribute to the ventilation rate in the space SP2 between the plate member 110 and the substrate 20. Hence, the ventilation rate in the space SP2 is obtained by taking account of only the flow rate of the gas GS2 supplied to the space SP2.

As described above, the volume of the space SP2 between the plate member 110 and the substrate 20, and the flow rate of the gas GS2 supplied to the space SP2 change depending on the position of the stage 30. A position of the stage 30 at which the ventilation rate in the space SP2 becomes minimum can be obtained in advance. It therefore suffices to determine the flow rate of the gas GS2 to be supplied from the gas supply unit 80 so that the ventilation rate in the space SP2 becomes higher than the ventilation rate in the apparatus at a position of the stage 30 at which the ventilation rate becomes minimum.

The clean gas GS2 to be supplied from the gas supply unit 80 will be explained. The gas GS2 suffices to be a gas that hardly generates particles, and can be, for example, clean dry air. The gas supply unit 80 may supply, as the gas GS2, clean dry air that is caused to pass through a ULPA filter or a line filter to further reduce particles, as needed.

The gas GS2 may be, for example, helium or nitrogen as long as the gas hardly generates particles. Some resins used in a photo-curing method have a property in which they are not cured if oxygen exists around. This is called oxygen inhibition. When the gas GS2 to be supplied from the gas supply unit 80 contains oxygen, it may cause oxygen inhibition. Thus, the gas GS2 is preferably oxygen-free helium or nitrogen, or another oxygen-free gas.

In this embodiment, as shown in FIG. 2, the nozzle 80a constituting the gas supply unit 80 is arranged on the plate member 110 in an almost square shape continuously surrounding the mold 40 and the nozzle 60a constituting the gas supply unit 60. However, the nozzle 80a need not always continuously surround the mold 40 and the nozzle 60a, and part of it may be discontinuous as long as the inflow of particles into the space SP2 between the plate member 110 and the substrate 20 can be suppressed. In this case, the portion, position, or the like at which the nozzle 80a is permitted to be discontinuous is obtained in advance by experiment or simulation. The nozzle 80a is not limited to almost the square shape, and may be arranged on the plate member 110 in an almost circular shape or an arbitrary closed curve shape.

Figure 7:
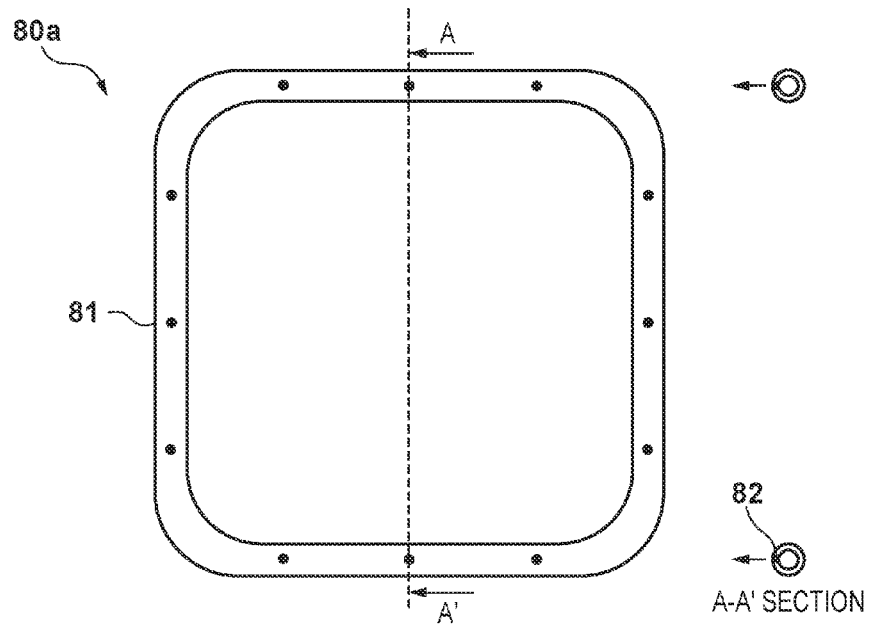
FIG. 7 is a view for explaining an example of a nozzle constituting the gas supply unit of the imprint apparatus shown in FIG. 1.

An example of the nozzle 80a constituting the gas supply unit 80 will be explained with reference to FIG. 7. As shown in FIG. 7, the nozzle 80a is constituted by forming holes 82 for spraying the gas GS2, in a nozzle member 81 obtained by bending a pipe having a cylindrical section into an almost square shape. The nozzle member 81 is connected to the supply source (not shown) of the gas GS2, and the gas GS2 from the supply source is sprayed from the holes 82 via the nozzle member 81. Although the nozzle member 81 is a single member in FIG. 7, it may be constituted by a plurality of members as long as the plurality of members are combined to form an almost closed curve shape.

In this embodiment, the nozzle member 81 is a metal pipe, for example, an electropolished stainless pipe, so-called EP pipe. However, the nozzle member 81 can be constituted by a member that does not generate particles, and may be constituted by a resin pipe or a ceramic pipe.

If a burr is generated by forming the hole 82 in the nozzle member 81, it may become a dust generation source when spraying the gas GS2 from the hole 82. If a surface around the hole 82 formed in the nozzle member 81 is rough, particles may be trapped and float sooner or later. It is therefore preferable to polish the nozzle member 81 in order to remove the burr and reduce the surface roughness after forming the holes 82 in the nozzle member 81. This polishing includes, for example, mechanical polishing, electropolishing, or chemical polishing.

In FIG. 7, the nozzle member 81 has a structure in which four portions of the metal pipe are bent at almost 90°. The number of bent portions of the metal pipe is preferably small because a small crack may be generated inside the bent portion of the metal pipe and serve as a dust generation source. To reduce the generation of a crack inside the bent portion of the metal pipe, it is preferable to increase the bending angle of the metal pipe to be an obtuse angle, and increase the curvature.

The nozzle member 81 may be constituted not by bending a metal pipe, but by welding a plurality of metal pipes. In this case, no crack (dust generation source) is generated inside the bent portion of the metal pipe, but a fume at the time of welding metal pipes may be generated as particles, and a measure against this is required.

In FIG. 7, the holes 82 are formed in a line in the nozzle member 81 with the same diameter and pitch. However, the holes 82 formed in the nozzle member 81 need not be in a line, and may be in a plurality of lines. The holes 82 need not have the same diameter, and several diameters may coexist. Accordingly, the flow rate of the gas GS2 sprayed from the holes 82 can be adjusted. Also, the holes 82 need not have the same pitch, and several pitches may coexist. The non-uniformity of the flow rate of the gas GS2 sprayed from the holes 82 can be adjusted. The number of holes 82 formed in the nozzle member 81, the diameter, and the pitch are preferably determined in advance based on the result of experiment, simulation, or the like so that the inflow of particles into the space SP2 between the plate member 110 and the substrate 20 can be suppressed.

Figure 8:
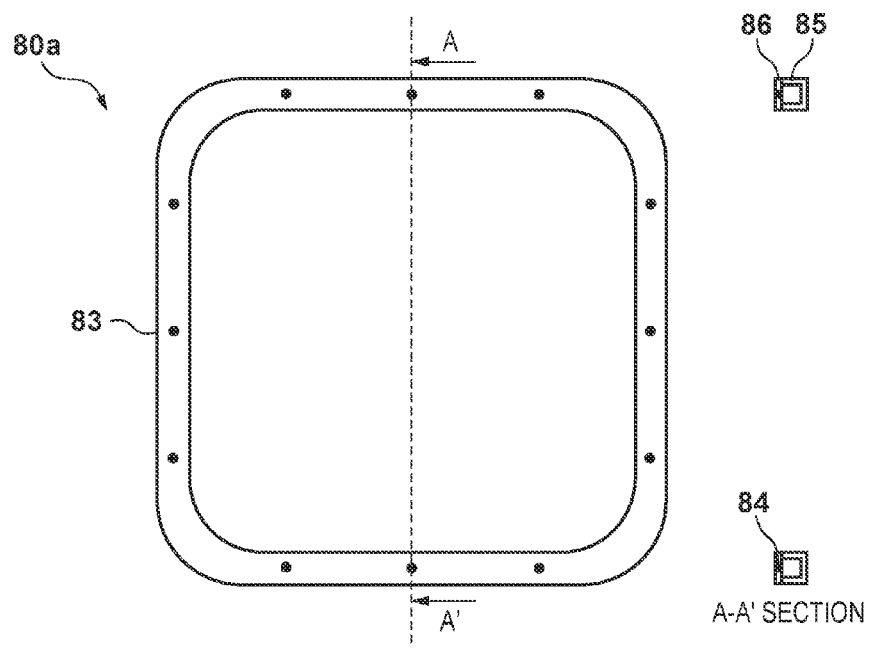
FIG. 8 is a view for explaining an example of a nozzle constituting the gas supply unit of the imprint apparatus shown in FIG. 1.

Another example of the nozzle 80a constituting the gas supply unit 80 will be explained with reference to FIG. 8. In FIG. 8, the nozzle 80a is constituted by a nozzle member 83 including a nozzle groove member 85 having a recessed section and a plate-like nozzle lid member 86. The nozzle 80a has a rectangular section. Holes 84 for spraying the gas GS2 are formed in the nozzle lid member 86. The nozzle member 83 is connected to the supply source (not shown) of the gas GS2, and the gas GS2 from the supply source is sprayed from the holes 84 via the nozzle member 83 (nozzle groove member 85 and nozzle lid member 86). Although the nozzle member 83 is constituted by a pair of the nozzle groove member 85 and nozzle lid member 86 in FIG. 8, it may be constituted by combining a plurality of pairs each of the nozzle groove member 85 and nozzle lid member 86 as long as an almost closed curve shape can be formed.

The above-described generation of a crack inside the bent portion of the metal pipe and a fume upon welding metal pipes can be prevented by constituting the nozzle member 83 by the nozzle groove member 85 and the nozzle lid member 86 in which the holes 84 are formed, as shown in FIG. 8. Since no metal pipe is used, the restriction on machining is eased. The nozzle member 83 having a large area by which the gas GS2 is sprayed can be constituted by widening the groove (width) of the nozzle groove member 85 and forming many holes 84 in the nozzle lid member 86. This can more reliably suppress the inflow of particles into the space SP2 between the plate member 110 and the substrate 20.

The nozzle member 83 is preferably constituted by bringing the nozzle groove member 85 and the nozzle lid member 86 into tight contact with each other without a gap. For example, the nozzle groove member 85 and the nozzle lid member 86 can tightly contact each other by using, for example, an adhesive or diffusion bonding. This can prevent unintended leakage of the gas GS2 from a portion (other than the holes) excluding the holes 84 formed in the nozzle lid member 86, and can more reliably suppress the inflow of particles into the space SP2 between the plate member 110 and the substrate 20.

However, the nozzle groove member 85 and the nozzle lid member 86 need not always tightly contact each other. If the flow rate of the gas GS2 leaking from the gap between the nozzle groove member 85 and the nozzle lid member 86 is negligible with respect to the flow rate of the gas GS2 sprayed from the holes 84 formed in the nozzle lid member 86, this gap may be permitted. In this case, the nozzle groove member 85 and the nozzle lid member 86 may be screwed, or the nozzle lid member 86 may be sandwiched between a plate member (not shown) and the nozzle groove member 85. Note that whether the flow rate of the gas GS2 leaking from the gap between the nozzle groove member 85 and the nozzle lid member 86 is negligible is confirmed in advance by experiment, simulation, or the like.

Figure 9:
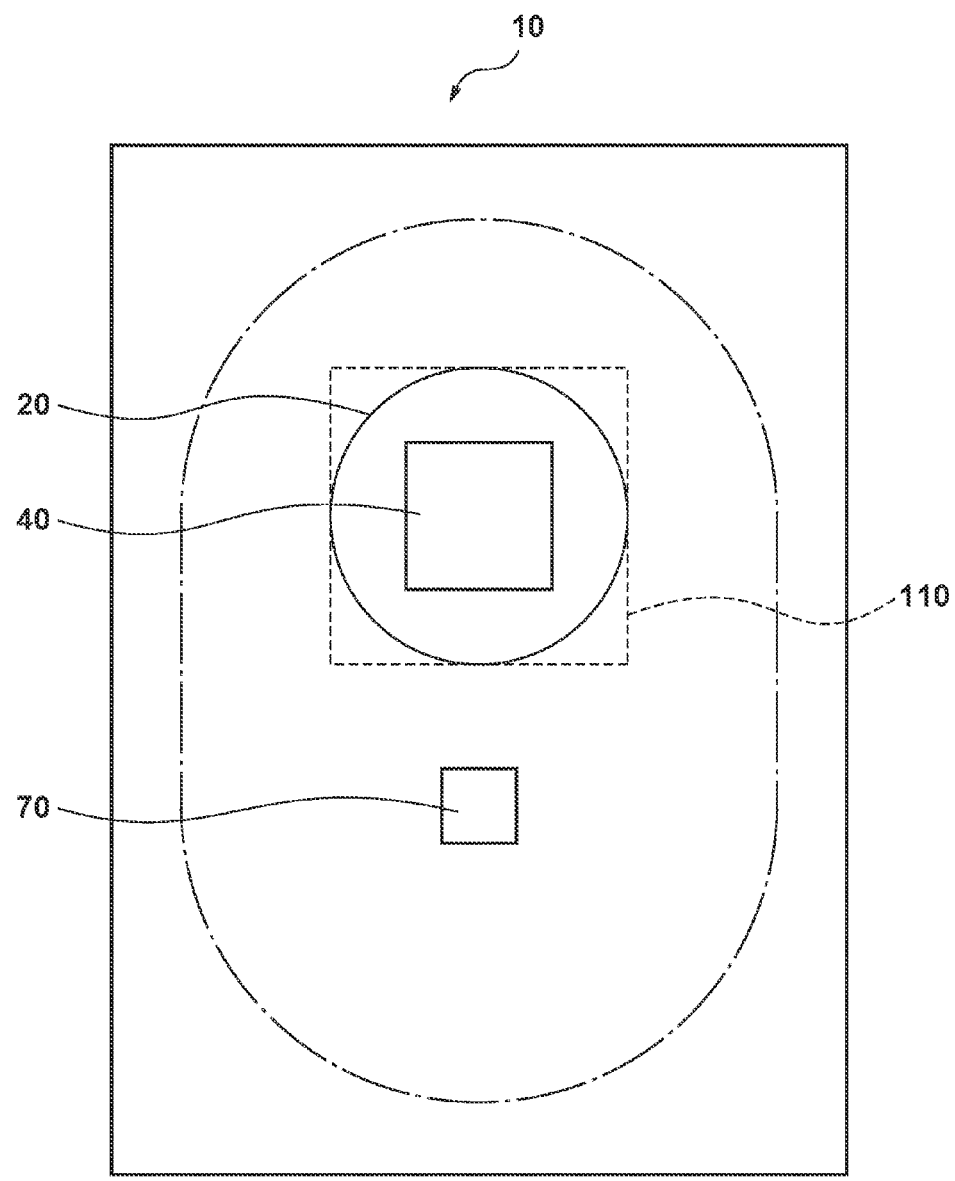
FIG. 9 is a view for explaining the function of the plate member of the imprint apparatus shown in FIG. 1.

The function of the plate member 110 will be explained with reference to FIG. 9. In FIG. 9, an ellipse indicated by a thick chain line represents the moving region of the substrate 20 held by the stage 30. The plate member 110 is preferably configured to cover the entire moving region of the substrate 20 held by the stage 30. The plate member 110 need not cover a region other than the moving region of the substrate 20. However, the moving region of the substrate 20 is wide, and it is not practical to cover such a wide region by the plate member 110 just enough. Thus, a region covered by the plate member 110 out of the moving region of the substrate 20 is preferably determined in consideration of the stay time of the substrate 20 in each process of imprint processing. In this embodiment, the plate member 110 is configured to cover at least part of the moving region of the substrate 20.

The imprint apparatus 10 takes the longest time (to be referred to as the "filling time" hereinafter) for processing of filling the pattern of the mold 40 with the resin while the substrate 20 stays in the apparatus, that is, in imprint processing. To supply the resin to the substrate 20 in imprint processing, the imprint apparatus 10 also takes time (to be referred to as the "dispense time" hereinafter) for processing of reciprocating between an imprint position below the mold 40 and the supply position of the dispenser 70 in order to supply the resin to the substrate 20 in imprint processing.

In FIG. 9, the plate member 110 is configured to cover the entire mold-side surface of the substrate 20 in a state in which the center of the mold 40 (chuck 45) and that of the substrate 20 coincide with each other. More specifically, the plate member 110 has a rectangular outer shape having one side of a length equal to the diameter of the substrate 20, specifically, a square outer shape, as indicated by a broken line.

Assuming that the ratio of the dispense time and the filling time is 1:10, the time for which the plate member 110 covers the substrate 20 is about 90% of the time taken for imprint processing. Assuming that particles are attached to the substrate 20 in proportion to the time of imprint processing, the plate member 110 having the square outer shape as shown in FIG. 9 can implement a 90% particle attachment reduction effect. Assuming that the ratio of the dispense time and the filling time is 1:1, the time for which the plate member 110 covers the substrate 20 is about 80% of the time taken for imprint processing. Assuming that particles are attached to the substrate 20 in proportion to the time of imprint processing, the plate member 110 having the square outer shape as shown in FIG. 9 can implement an 80% particle attachment reduction effect. The plate member 110 is preferably configured to cover up to a dispenser-side region out of the moving region of the substrate 20 as the ratio of the dispense time and the filling time decreases.

Although the plate member 110 is constituted by a member different from the head 50 and is supported by the base 55 in this embodiment, it may be constituted by the same member as the head 50, that is, as part of the head 50. The plate member 110 may be constituted by the same member as that of the gas supply unit 80, that is, as part of the gas supply unit 80.

In the imprint apparatus 10 according to the first embodiment, the plate member 110 defines the space SP2 between the plate member 110 and the substrate 20, and the gas GS2 is supplied from the gas supply unit 80 to the space SP2 so as to form an air flow from the space SP2 toward the space SP3. In the imprint apparatus 10, the inflow of the particles 90 floating in the apparatus into the space SP2 is suppressed, so the number of particles attached to the substrate 20 is reduced. The imprint apparatus 10 can therefore reduce pattern defects and provide an article such as a high-quality device (semiconductor device, magnetic storage medium, or liquid crystal display element) at high throughput and low cost.

<Second Embodiment>

Figure 10:
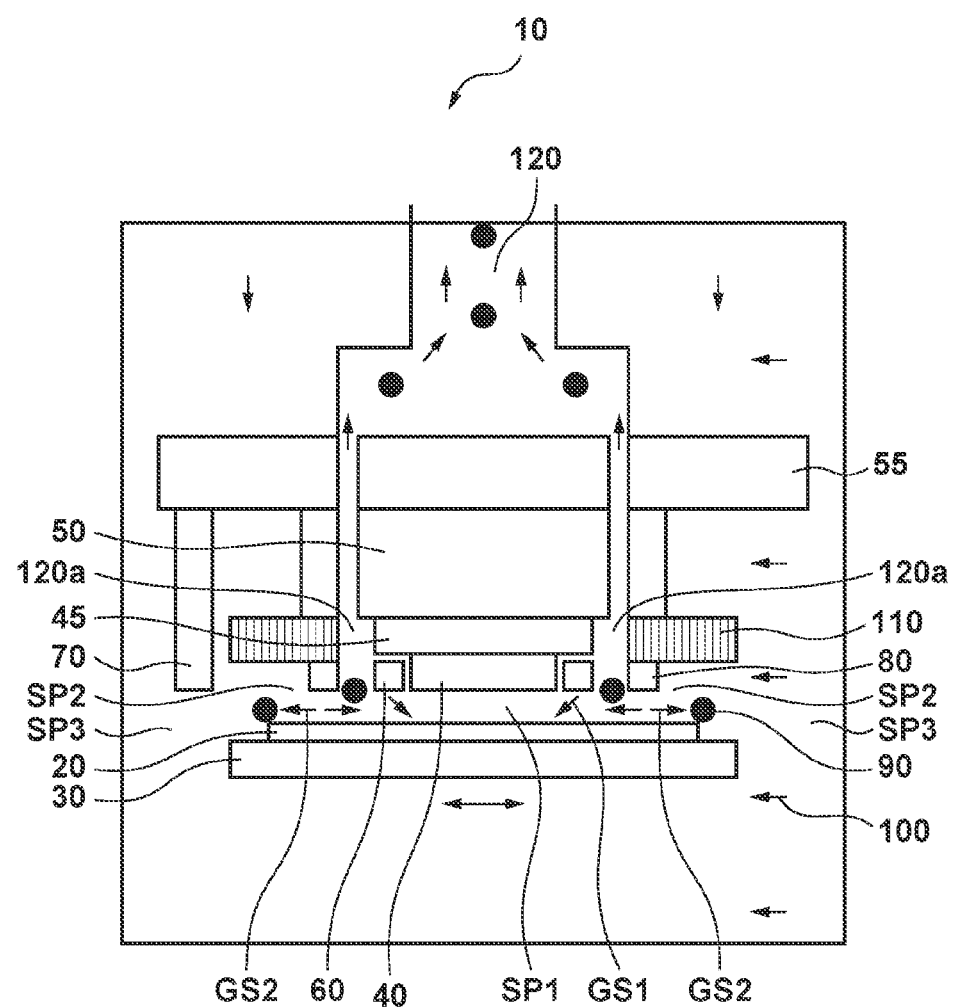
FIG. 10 is a schematic view showing the arrangement of an imprint apparatus according to the second embodiment of the present invention.

FIG. 10 is a schematic view showing the arrangement of an imprint apparatus 10 according to the second embodiment of the present invention. In this embodiment, the imprint apparatus 10 includes an exhaust unit 120 that exhausts a gas in a space SP2 between a plate member 110 and a substrate 20. As described in the first embodiment, a gas supply unit 80 is effective in suppressing the inflow of particles into the space SP2 between the plate member 110 and the substrate 20. According to the first embodiment, when particles are generated inside the gas supply unit 80, they may be attached to the substrate 20. Similarly, when particles flow into the space SP2 between the plate member 110 and the substrate 20, they may be attached to the substrate 20.

According to the second embodiment, the exhaust unit 120 is provided inside the gas supply unit 80 to exhaust a gas in the space SP2 between the plate member 110 and the substrate 20. The exhaust unit 120 includes an exhaust outlet 120a that is formed between the side surface of a chuck 45 and the plate member 110 to exhaust a gas in the space SP2. The exhaust unit 120 exhausts, from the imprint apparatus 10 via the exhaust outlet 120a, a gas containing particles generated inside the gas supply unit 80 and particles flowing into the space SP2. In this fashion, the imprint apparatus 10 according to this embodiment can suppress the inflow of particles into the space SP2, and reduce the attachment, to the substrate 20, of particles generated inside the gas supply unit 80 and particles flowing into the space SP2.

According to this embodiment, the exhaust outlet 120a in the exhaust unit 120 is constituted by one opening so as to surround the chuck 45. However, the exhaust outlet 120a need not be constituted by one opening, and may be constituted by a plurality of openings. Alternatively, an exhaust nozzle may be constituted separately. However, a mold 40 and the gas supply unit 60 are arranged inside the gas supply unit 80, so it is difficult under the spatial restriction to arrange the exhaust nozzle. In this embodiment, therefore, the exhaust outlet 120a is arranged inside the gas supply unit 80 and outside the mold 40 and the gas supply unit 60, so as to surround the chuck 45. While avoiding the spatial restriction, the gas supply unit 80 and the exhaust unit 120 can be arranged.

Even when particles are generated inside the gas supply unit 80 or when particles flow into the space SP2 between the plate member 110 and the substrate 20, the imprint apparatus 10 according to the second embodiment can reduce the attachment of the particles to the substrate 20.

<Third Embodiment>

Figure 11:
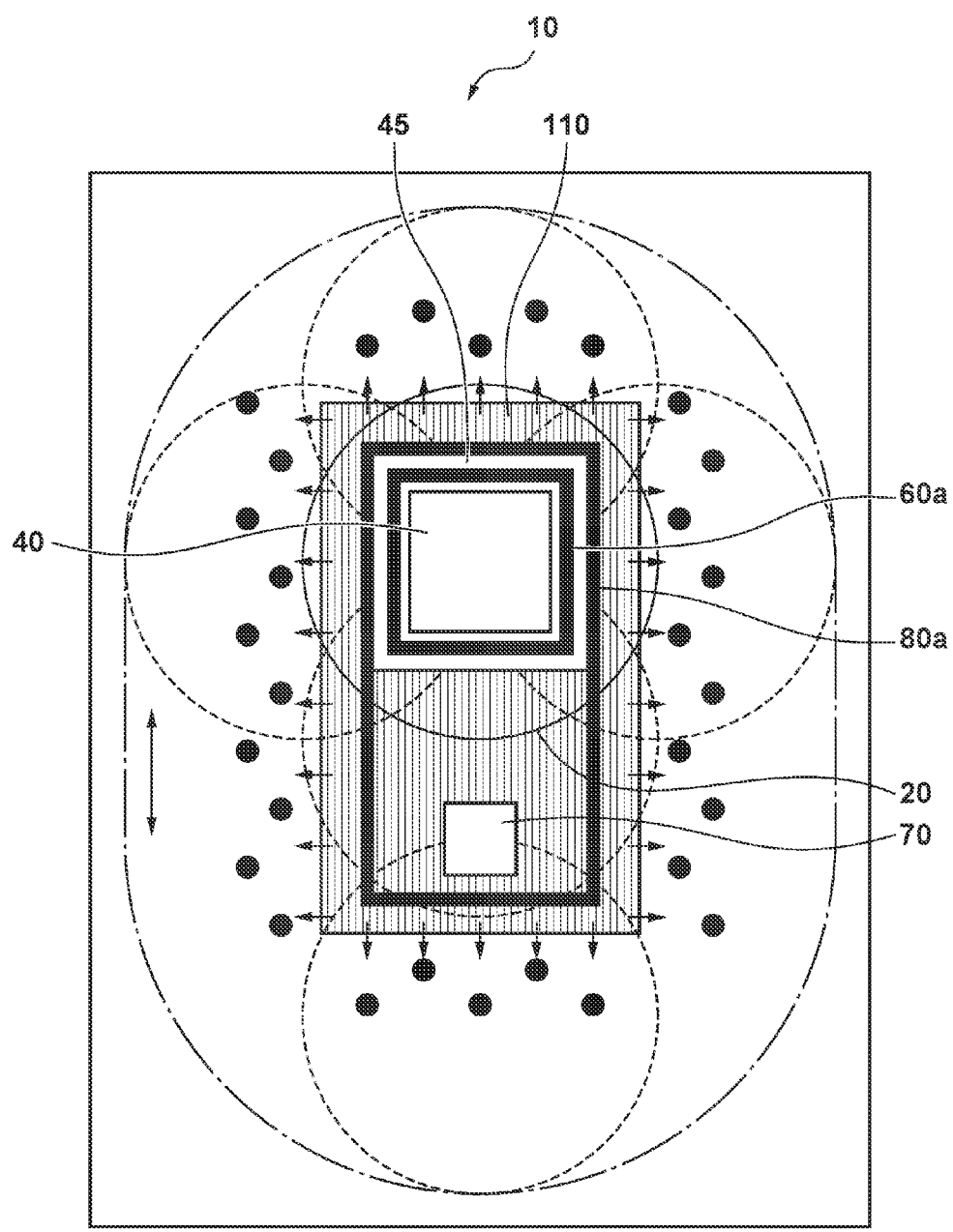
FIG. 11 is a view for explaining an imprint apparatus according to the third embodiment of the present invention.

The arrangement of an imprint apparatus 10 according to the third embodiment of the present invention will be explained with reference to FIG. 11. In this embodiment, a nozzle 80a constituting a gas supply unit 80 is arranged outside a chuck 45 and a dispenser 70, that is, to surround a region including the chuck 45 and the dispenser 70. The dispenser 70 is generally arranged at an interval from the chuck 45. When part of the nozzle 80a is arranged in a region between the chuck 45 and the dispenser 70 (FIG. 2), a substrate 20 to which a resin is supplied from the dispenser 70 passes below the nozzle 80a until it moves to an imprint position immediately below a mold 40. At this time, the resin on the substrate may be influenced by a gas GS2 sprayed from the nozzle 80a.

In this embodiment, the nozzle 80a is arranged to surround the region including the chuck 45 and the dispenser 70 so that the gas GS2 sprayed from the nozzle 80a does not contact the resin on the substrate and the resin on the substrate is not influenced by the gas GS2.

While suppressing the influence of the gas GS2 on the resin on the substrate, the imprint apparatus 10 according to the third embodiment can suppress the inflow of particles 90 floating in the apparatus into a space SP2, and reduce the number of particles attached to the substrate 20.

<Fourth Embodiment>

A method of manufacturing a device (for example, a semiconductor device, magnetic storage medium, or liquid crystal display element) as an article will be explained. This manufacturing method includes a step of forming a pattern on a substrate (for example, a wafer, glass plate, or film substrate) using an imprint apparatus 10. This manufacturing method further includes a step of processing the substrate on which the pattern has been formed. The processing step can include a step of removing the residual film of the pattern. In addition, the method can include other known steps such as a step of etching the substrate using the pattern as a mask. The method of manufacturing an article according to this embodiment is advantageous over the related art in terms of at least one of the performance, quality, productivity, and production cost of articles.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-244381 filed on Dec. 2, 2014, which is hereby incorporated by reference herein in its entirety.

What is claimed is:

1. An imprint apparatus that performs imprint processing of forming a pattern of an imprint material on a substrate using a mold, the apparatus comprising:
   a chuck configured to hold the mold;
   a head configured to support the chuck to be able to drive the chuck, the head being fixed to a base;
   a plate member arranged between the base and the substrate so as to surround the chuck;
   a first supply unit configured to supply a first gas to a first space between the plate member and a substrate stage; and
   a second supply unit configured to supply a second gas different from the first gas to a space between the mold and the substrate,
   wherein the first supply unit includes a first nozzle configured to spray the first gas, and forms an air flow, in the first space, in only one direction from a position of the first nozzle toward a second space, the second space and the mold being on opposite sides of the position of the first nozzle from each other, wherein the second supply unit includes a second nozzle configured to spray the second gas, and forms an air flow from a position of the second nozzle toward the space between the mold and the substrate, and wherein the second nozzle and the first nozzle are arranged, in order, from a center of the mold to the second space.

2. The apparatus according to claim 1, wherein the plate member is arranged between a surface of the chuck on a side of the head and a surface, on a side of the substrate, of the mold held by the chuck.

3. The apparatus according to claim 1, further comprising the substrate stage configured to hold the substrate and move, wherein the plate member covers at least part of a moving region of the substrate held by the substrate stage.

4. The apparatus according to claim 1, wherein the plate member covers an entire surface of the substrate on a side of the mold in a state in which a center of the chuck and a center of the substrate coincide with each other.

5. The apparatus according to claim 1, wherein the plate member has a rectangular outer shape having one side of a length equal to a diameter of the substrate.

6. The apparatus according to claim 1, wherein at least part of the first nozzle is positioned on the substrate when performing the imprint processing.

7. The apparatus according to claim 1, further comprising an exhaust unit configured to exhaust the first space.

8. The apparatus according to claim 7, wherein the exhaust unit includes, between a side surface of the chuck and the plate member, an exhaust outlet configured to exhaust the first space.

9. The apparatus according to claim 1, further comprising a dispenser arranged at an interval from the chuck and configured to discharge the imprint material onto the substrate, wherein the first supply unit is arranged to surround a region including the chuck and the dispenser.

10. The apparatus according to claim 1, wherein the first gas includes at least one of clean dry air, helium, and nitrogen.

11. The apparatus according to claim 1, wherein the second gas includes helium.

12. The apparatus according to claim 1, wherein the first nozzle is arranged to surround the chuck.

13. The apparatus according to claim 1, wherein the first nozzle is arranged to surround the second nozzle.

14. The apparatus according to claim 1, wherein the first nozzle is arranged on the plate member.

15. The apparatus according to claim 1, further comprising a filter configured to reduce a particle in a gas to supply the gas into the imprint apparatus, wherein the first supply unit forms the air flow so as to suppress that a particle in the gas supplied through the filter enters into the first space.

* * * * *